United States Patent
Sano et al.

(10) Patent No.: US 10,930,891 B2
(45) Date of Patent: Feb. 23, 2021

(54) ORGANIC DEVICE, DISPLAY APPARATUS, IMAGE CAPTURING APPARATUS, ILLUMINATION APPARATUS, AND MOVING BODY

(71) Applicant: CANON KABUSHIKI KAISHA, Tokyo (JP)

(72) Inventors: Hiroaki Sano, Yokohama (JP); Takayuki Ito, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/812,984

(22) Filed: Mar. 9, 2020

(65) Prior Publication Data
US 2020/0303683 A1    Sep. 24, 2020

(30) Foreign Application Priority Data
Mar. 20, 2019   (JP) ............................ JP2019-053478

(51) Int. Cl.
| H01L 51/52 | (2006.01) |
| H01L 51/56 | (2006.01) |
| H01L 27/32 | (2006.01) |

(52) U.S. Cl.
CPC ........ *H01L 51/5271* (2013.01); *H01L 27/322* (2013.01); *H01L 27/3234* (2013.01); *H01L 27/3272* (2013.01); *H01L 27/3276* (2013.01); *H01L 51/56* (2013.01)

(58) Field of Classification Search
CPC .............. H01L 27/3244–3279; H01L 51/5271
See application file for complete search history.

(56) References Cited

U.S. PATENT DOCUMENTS

| 9,269,924 B2 | 2/2016 | Nozawa et al. | |
| 9,634,067 B2 | 4/2017 | Nozawa et al. | |
| 10,115,778 B2 | 10/2018 | Nozawa et al. | |
| 10,541,289 B2 | 1/2020 | Nozawa et al. | |
| 2014/0361316 A1 | 12/2014 | Nozawa et al. | |
| 2015/0090991 A1* | 4/2015 | Ishii ..................... H01L 27/3272 257/40 |
| 2016/0126294 A1 | 5/2016 | Nozawa et al. | |
| 2018/0240854 A1 | 8/2018 | Nozawa et al. | |
| 2019/0027544 A1 | 1/2019 | Nozawa et al. | |

FOREIGN PATENT DOCUMENTS

JP     2014-235959 A    12/2014

* cited by examiner

*Primary Examiner* — Daniel P Shook
(74) *Attorney, Agent, or Firm* — Venable LLP (57) ABSTRACT

An organic device comprising light emitting elements arranged on a substrate is provided. Each of the light emitting elements comprises, from a side of the substrate, a reflection layer, a light-shielding member, a first electrode, an organic layer including a light emitting layer, and a second electrode. The light emitting elements comprise a first element and a second element arranged adjacent to each other. A length in a second direction of a portion of the light-shielding member is longer than that of the portion in a first direction, the portion being arranged in a region where the first and second element are adjacent to each other, and the first direction is a direction in which the first and second element are arranged and the second direction is a direction perpendicular to the first direction.

20 Claims, 9 Drawing Sheets

ORGANIC DEVICE, DISPLAY APPARATUS, IMAGE CAPTURING APPARATUS, ILLUMINATION APPARATUS, AND MOVING BODY

BACKGROUND OF THE INVENTION

Field of the Invention

The present invention relates to an organic device, a display apparatus, an image capturing apparatus, an illumination apparatus, and a moving body.

Description of the Related Art

An organic device that comprises an organic EL light emitting element has gained attention. There is known a method (to be referred to as a white+CF method hereinafter) that uses a light emitting element which emits white light and a color filter to increase the resolution of an organic device. Since an organic layer is deposited on the entire surface of a substrate in the white+CF method, the resolution can be increased easily by adjusting the pixel size, the pitch between the pixels, or the like compared to a method in which the organic layer is deposited for each color by using a metal mask. Japanese Patent Laid-Open No. 2014-235959 discloses that a pixel electrode which is to be provided for each pixel will be formed by a transparent conductive film and a power supply line that functions as a reflection layer will be arranged between the pixel electrode and a substrate in an electro-optic device employing the white+CF method. Constructing an optical cavity structure between the reflection layer and a counter electrode arranged via the pixel electrode and a light emitting layer will improve the light extraction efficiency and color reproducibility.

SUMMARY OF THE INVENTION

In the structure disclosed in Japanese Patent Laid-Open No. 2014-235959, there is a possibility that color mixing will occur if light reflected by the reflection layer disperses in the direction of an adjacent pixel and passes through the color filter of the adjacent pixel.

Some embodiments of the present invention provide a technique advantageous in improving the color reproducibility of an organic device.

According to some embodiments, an organic device comprising a substrate and light emitting elements arranged on a surface of the substrate, wherein each of the light emitting elements comprises, from a side of the surface, a reflection layer, a light-shielding member arranged above the reflection layer, a first electrode arranged above the light-shielding member, an organic layer comprising a light emitting layer which is arranged over the first electrode, and a second electrode arranged over the organic layer, wherein the light emitting elements comprise a first light emitting element and a second light emitting element arranged adjacent to each other, wherein, in an orthogonal projection with respect to the surface, a length in a second direction of a portion of the light-shielding member is longer than a length of the portion in a first direction, the portion being arranged in a region where the first light emitting element and the second light emitting element are adjacent to each other, and wherein the first direction is a direction in which the first light emitting element and the second light emitting element are arranged and the second direction is a direction perpendicular to the first direction, is provided.

According to some other embodiments, an organic device comprising a substrate and light emitting elements arranged on a surface of the substrate, wherein each of the light emitting elements comprises, from a side of the surface, a reflection layer, a light-shielding member arranged above the reflection layer, a first electrode arranged above the light-shielding member, an organic layer comprising a light emitting layer which is arranged over the first electrode, and a second electrode arranged over the organic layer, and in an orthogonal projection with respect to the surface, the light-shielding member is arranged along an edge of the first electrode, is provided.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 1A:
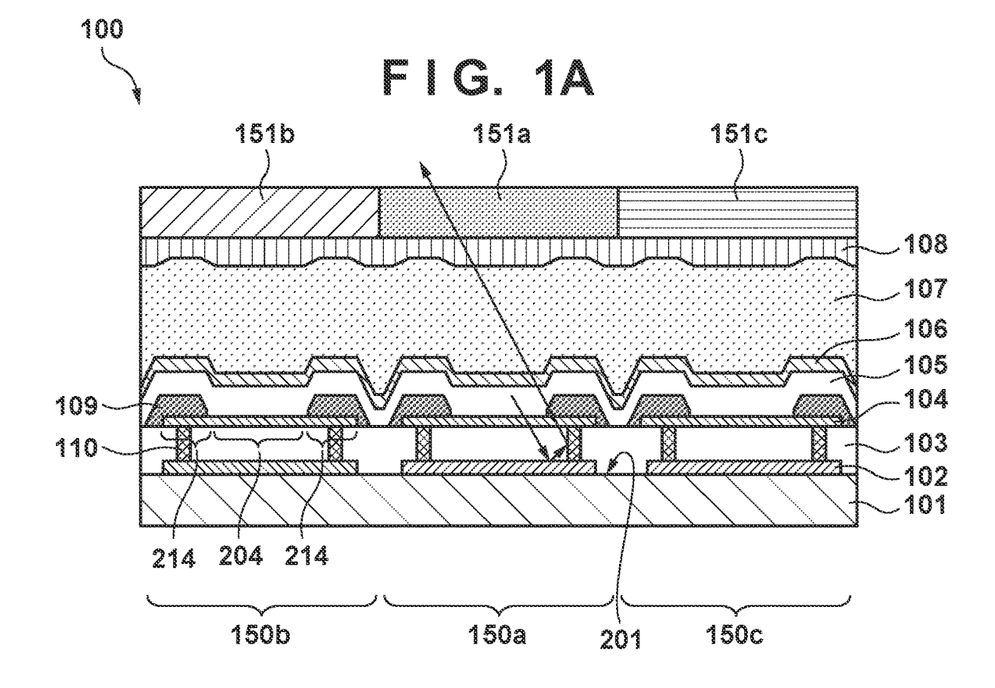
FIGS. 1A and 1B are sectional views of an organic device according to an embodiment.

The structure of an organic device according to an embodiment of the present invention will be described with reference to FIGS. 1A to 5. FIG. 1A is a sectional view showing the structure of an organic device 100 of the present invention. In this embodiment, light emitting elements 150 are arranged in the organic device 100, and each light emitting element comprises an organic layer 105 made of an organic light emitting material such as organic EL or the like. The organic device 100 can function as a display apparatus or the like.

The organic device 100 comprises a substrate 101 and the light emitting elements 150 arranged on a surface 201 of the substrate 101. Each of the light emitting elements 150 comprises, from the side of the surface 201 of the substrate 101, a reflection layer 102 which reflects light, a light-shielding member arranged above the reflection layer 102, an electrode 104 arranged above the light-shielding member, the organic layer 105 which comprises a light emitting layer arranged over the electrode 104, and an electrode 106 arranged over the organic layer 105. An insulation layer 103 is arranged between the reflection layer 102 and the electrode 104. Also, each of the light emitting elements 150 comprises a sealing layer 107 arranged on the electrode 106 and a planarization layer 108 arranged on the sealing layer 107. Each of the light emitting elements 150 can also comprise a color filter 151 which is arranged on the planarization layer 108. In the organic device 100, as shown in FIG. 1A, light emitting elements 150a to 150c may be arranged adjacent to each other and comprise color filters 151a to 151c, respectively, which transmit different colors from each other. This allows the organic device 100 to perform, for example, display in full color. In addition, a black matrix material that absorbs light, a reflecting member 110 that reflects light, or the like can be used as the light-shielding member arranged on the reflection layer 102. In this embodiment, assume that the reflecting member 110 will be used as the light-shielding member in the description hereinafter.

A material that can support each component of the light emitting elements 150 is used as the substrate 101. Glass, plastic, a semiconductor material such as silicon, a metal, or the like is used as the substrate 101. A switching element such as a transistor, wiring, an interlayer insulating film (not shown), and the like may also be formed on the substrate 101.

The reflection layer 102 of each light emitting element 150 emits light by the organic layer 105 and reflects the light traveling in the direction of the substrate 101. From the point of view of light emission efficiency of each light emitting element 150, a material that has a reflectivity of 50% or more with respect to visible light can be used as the reflection layer 102. More specifically, a metal such as Al, Ag, or the like, an alloy obtained by doping the metal with Si, Cu, Ni, Nd, Ti, or the like can be used as the reflection layer 102. More specifically, the reflection layer 102 can comprise a barrier layer on the light-reflecting surface. A metal such as Ti, W, Mo, Au, or the like, an alloy of these metals, or a transparent conductive oxide material such as ITO, IZO, or the like can be used as the material of the barrier layer of the reflection layer 102.

The insulation layer 103 is arranged between the reflection layer 102 and the electrode 104, and may be made of an inorganic material such as silicon nitride (SiN), silicon oxynitride (SiON), silicon oxide (SiO), or the like. The insulation layer 103 can be formed by using a known technique such as sputtering, chemical vapor deposition (CVD), or the like. The insulation layer 103 can be formed by using an organic material such as an acrylic resin or a polyimide resin. Although the insulation layer 103 is formed from a single layer in the arrangement shown in FIG. 1A, the insulation layer 103 may be formed by a plurality of layers.

The electrode 104 can be a separate electrode individually arranged for each light emitting element 150. In this embodiment, the electrode 104 is a transparent conductive film. ITO, IZO, AZO, IGZO, or the like is used as the electrode 104.

The organic layer 105 is arranged on the electrode 104 of the light emitting element 150. The organic layer 105 comprises a light emitting layer using an organic light emitting material such as an organic EL. The organic layer 105 can be formed by a known technique such as vapor deposition, spin-coating, or the like. The organic layer 105 can be formed from a plurality of layers. A hole injection layer, a hole transport layer, an electron blocking layer, a light emitting layer, a hole blocking layer, an electron transport layer, an electron injection layer, and the like may be the layers comprised in the organic layer 105. The light emitting layer emits light based on the recombination of the hole injected from anode and an electron injected from a cathode. The light emitting layer may be formed from a single layer or a plurality of layers. A red light emitting material, a green light emitting material, and a blue light emitting material can be comprised in the one light emitting layer or one of the light emitting layers. White light can be obtained by mixing each color of emitted light. In addition, light emitting materials that have a complementary color relationship such as the blue light emitting material and a yellow light emitting material may be comprised in the one light emitting layer or one of the light emitting layers.

The organic layer 105 may also be shared by the light emitting elements 150 as shown in FIG. 1A. However, the present invention is not limited to this. The organic layer 105 may be entirely or partially patterned for each light emitting element 150.

The electrode 106 is arranged on the organic layer 105 of each light emitting element 150 and has a light transmitting property. The electrode 106 may be a semi-transmitting film having a property (a semi-transmitting reflectivity) that transmits a part of the light which has reached the electrode 106 and reflects the rest of the light. The electrode 106 can be made of, for example, a transparent material such as an transparent conductive oxide material or the like, a single metal such as Al, AG, Au, or the like, an alkali metal such as Li, Cs, or the like, an alkaline earth metal such as Mg, Ca, Ba, or the like, or an alloy comprising these metal materials. An alloy mainly made of Mg or Ag may be used as the electrode 106 which is a semi-transmitting film. The electrode 106 also can have, for example, a stacked structure using the above-described materials as long as it has an appropriate light transmittance. In addition, the electrode 106 may be shared by the light emitting elements 150 as shown in FIG. 1A.

In this embodiment, as described above, the electrode 104 is the anode and the electrode 106 is the cathode. However, the present invention is not limited to this, and the electrode 104 may be the cathode and the electrode 106 may be the anode. In such a case, the stacked structure of the organic layer 105 described above can be switched appropriately.

The sealing layer 107 is arranged on the electrode 106 so as to cover at least the organic layer 105. The sealing layer 107 is translucent and contains an inorganic material with extremely low permeability to oxygen and water from the outside. The sealing layer 107 can be made of an inorganic material such as SiN, SiON, SiO, aluminum oxide ($Al_2O_3$), titanium oxide ($TiO_2$), or the like. Among these materials, SiN, SiON, and $Al_2O_3$ have a high sealing performance against oxygen and water. The sealing layer 107 can be formed by using CVD, atomic layer deposition (ALD), sputtering, or the like. The sealing layer 107 may have a single-layer structure as long as its water shielding performance is sufficient, or may have a stacked structure by combining the materials and the formation methods described above. The light emitting element 150 can share the sealing layer 107 as shown in FIG. 1A.

In this embodiment, the planarization layer 108 is arranged on the sealing layer 107. The planarization layer 108 is made of a material that has light transmissivity. The material to be used for the planarization layer 108 may be an inorganic material or an organic material.

The color filters 151 are arranged on the planarization layer 108. In this embodiment, the color filter 151a, the color filter 151b, and the color filter 151c are color filters that transmit different colors from each other. As a result, in the organic device 100, each of the light emitting element 150a, the light emitting element 150b, and the light emitting element 150c can be set as a sub-pixel, and the three sub-pixels can be regarded together as a single main pixel. The color filters 151a, 151b, and 151c can be color filters that transmit red light, green light, and blue light, respectively. The organic device 100 can perform display in full color by additive color mixing of these sub-pixels.

A partition wall 109 which is an insulator arranged so as to cover the end of the electrode 104 can be provided on each light emitting element 150. At this time, the electrode 104 can comprise a central portion 204 which contacts the organic layer 105 and a peripheral portion 214 which surrounds the central portion 204 and is a portion where the partition wall 109 as the insulator between the electrode 104 and the organic layer 105 is arranged. The partition wall 109 can be made of an inorganic material such as SiN, SiON, SiO, or the like in the same manner as the insulation layer 103. The partition wall 109 can be formed by using a known technique such as sputtering, CVD, or the like. The partition wall 109 may also be formed by using an organic material such as an acrylic resin or a polyimide resin.

The reflecting member 110 is arranged between the reflection layer 102 and the electrode 104 as shown in FIG. 1A. The reflecting member 110 is also arranged, as shown in FIG. 1A and FIGS. 2A to 2D, along the edge of the electrode 104 in an orthogonal projection with respect to the surface 201 of the substrate 101. In addition, in an orthogonal projection with respect to the surface 201 of the substrate 101, the reflecting member 110 may be arranged at a position which overlaps the peripheral portion 214 of the electrode 104 as shown in FIG. 1A. The reflecting member 110 can be made of a metal such as Al, Ag, Au, Cu, W, Ti, TiN, or the like or an alloy obtained by doping the metal with Si, Ni, Nd, Ti, or the like. The reflecting member 110 can be formed by depositing a single layer or stacked metal film by sputtering, CVD, plating, or the like.

Figure 5:
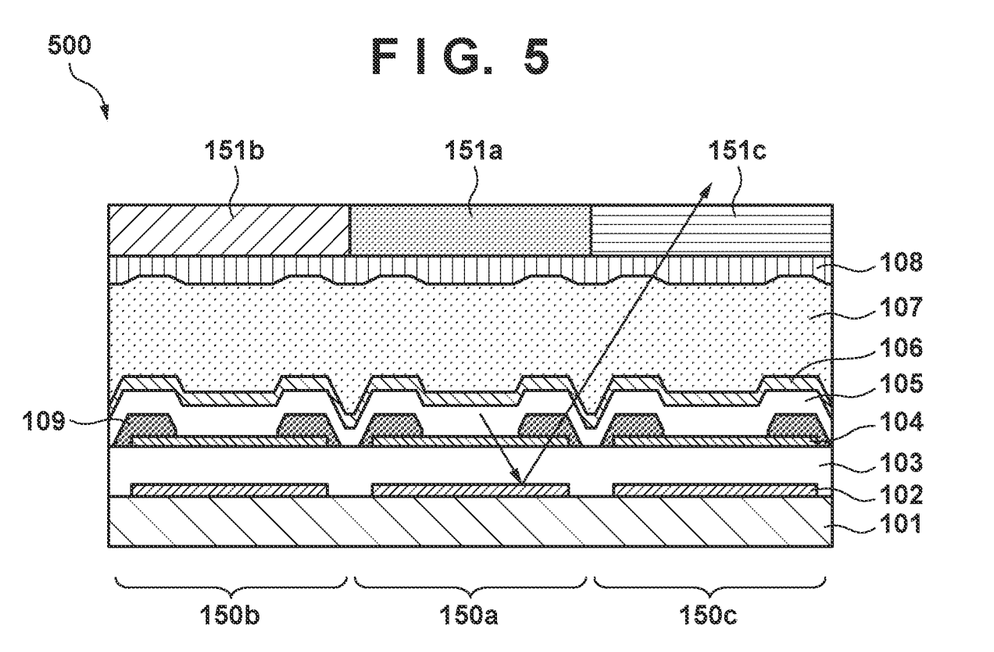
FIG. 5 is a sectional view of an organic device according to a comparative example.

The effect of the reflecting member 110 will be described next. FIG. 5 is a sectional view of an organic device 500 of a comparative example without the reflecting member 110. A part of the light which is emitted from the organic layer 105 of the light emitting element 150a and travels toward the reflection layer 102 is reflected by the reflection layer 102 in the manner shown by an arrow indicated in FIG. 5. The reflected light is transmitted through the color filter 151c of the light emitting element 150c, thus causing color mixing to occur. That is, the image quality will degrade in the organic device 500.

On the other hand, according to this embodiment, the reflecting member 110 is provided between the reflection layer 102 and the electrode 104, along the edge of the electrode 104. Arranging the reflecting member 110 will cause the part of the light which is emitted from the organic layer 105 of the light emitting element 150a and is reflected by the reflection layer 102 to be reflected by the reflecting member 110 in the manner shown by an arrow indicated in FIG. 1A. The light reflected by the reflecting member 110 is transmitted through the color filter 151a of the light emitting element 150a. As a result, color mixing between the mutually adjacent light emitting elements 150 is reduced, and the color purity of the organic device 100 improves. A similar effect can be obtained by using, as the light-shielding member, a light absorbing material such as a black matrix material instead of using the reflecting member 110 as described above.

Figure 2A:
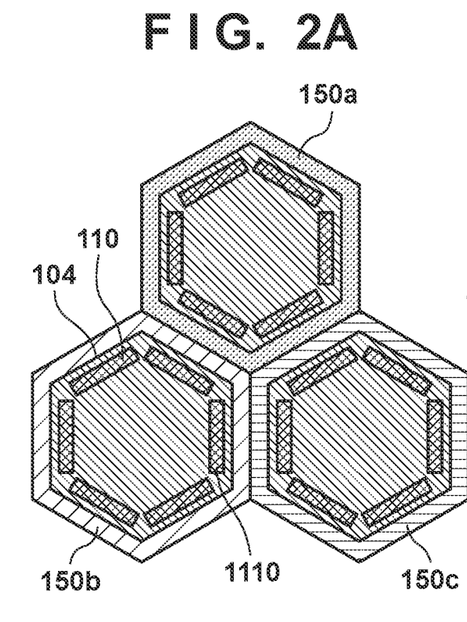
FIGS. 2A to 2D are plan views of the organic device shown in FIG. 1A.
Figure 2B:
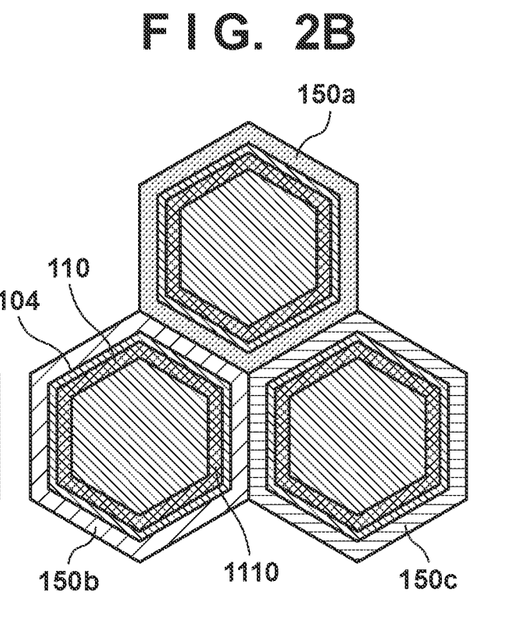
Figure 2C:
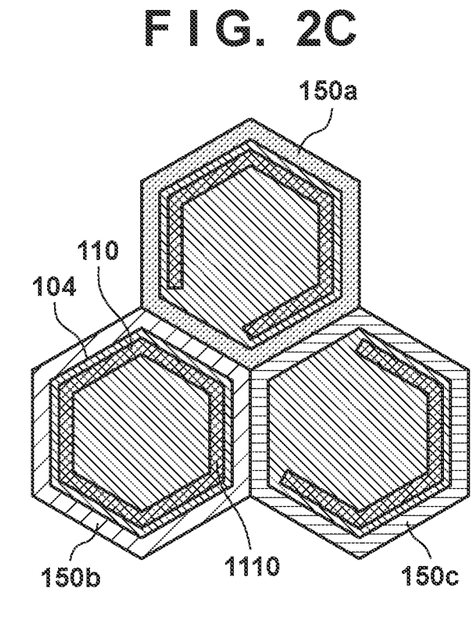

The light emitting element 150b and the light emitting element 150c which are adjacent to each other will be of focus here. Also, assume that a direction (the horizontal direction in FIGS. 2A to 2D) in which the light emitting element 150b and the light emitting element 150c are arranged is a first direction, and a direction perpendicular to the first direction (the vertical direction in FIGS. 2A to 2D) is a second direction. In this case, as shown in FIGS. 2A to 2C, in an orthogonal projection with respect to the surface 201, the length in the second direction can be longer than the length in the first direction in a portion 1110, of the reflecting member 110, which is arranged in a region where the light emitting element 150b and the light emitting element 150c are adjacent to each other. In this case, as shown in FIGS. 2A to 2C, the second direction can be a direction along the edge of the electrode 104 in the portion where the light emitting element 150b and the light emitting element 150c are adjacent to each other.

Figure 2D:
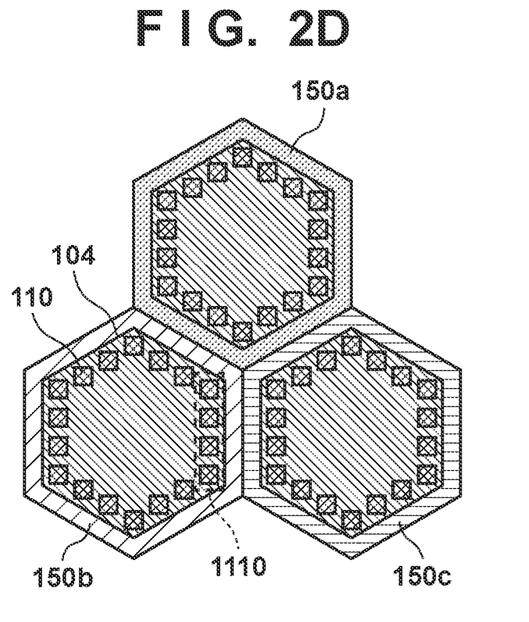

As shown in FIG. 2B, the reflecting member 110 may be arranged continuously along the perimeter of the edge of the electrode 104. Also, as shown in FIG. 2A, even if the reflecting member 110 is arranged partially along the edge of the electrode 104 and there is a gap between the individual reflecting members 110, the color mixing suppressing effect can be obtained. In addition, as shown in FIG. 2C, in an orthogonal projection with respect to the surface 201 of the substrate 101, the reflecting member 110 can be arranged in only one of a portion, which is adjacent to the light emitting element 150b, of the edge of the electrode 104 arranged in the light emitting element 150a, and a portion, which is adjacent to the light emitting element 150a, of the edge of the electrode 104 arranged in the light emitting element 150b. The effect of suppressing color mixing between two adjacent light emitting elements 150 can be obtained as long as the reflecting member 110 is arranged on at least one of the portions where the light emitting elements 150 are adjacent to each other. Furthermore, as shown in FIG. 2D, the reflecting member 110 may be formed by columnar members. For example, in an orthogonal projection with respect to the surface 201 of the substrate 101, each reflecting member 110 may be a square, a circle, or a polygon other than a square. In this case, for example, the total length of the the reflecting members 110 arrayed along the side of the edge of each light emitting element 150 will be considered. In this case, in an orthogonal projection with respect to the surface 201, for example, the length in the second direction can be longer than the length in the first direction in a portion 1110 in the total length of the reflecting members 110, of the reflecting members 110, which are arranged in the region where the light emitting element 150b and the light emitting element 150c are adjacent to each other.

Also, the reflecting member 110 may function as a plug that supplies power from the reflection layer 102 to the electrode 104. That is, the reflection layer 102 can form a part of the wiring pattern for supplying power to the electrode 104, and the reflecting member 110 electrically connects the reflection layer 102 to the electrode 104. Using the reflecting member 110 as a plug will allow the reflecting member 110 to be arranged on each light emitting element 150 without increasing the number of steps which are performed to form the organic device 100.

Figure 1B:
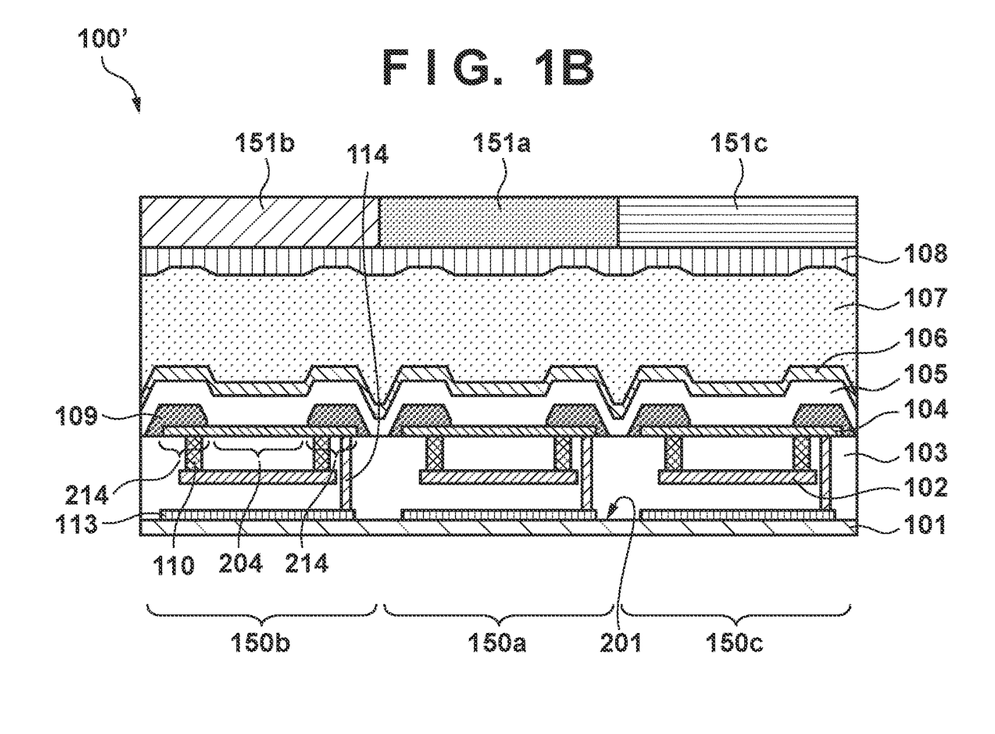

Furthermore, the reflecting member 110 need not be a plug for supplying power to the electrode 104. For example, in the manner of an organic device 100' shown in FIG. 1B, each light emitting element 150 may further comprise, between the reflection layer 102 and the surface 201 of the substrate 101, a wiring pattern 113 for supplying power to the electrode 104. In this case, a plug 114 that electrically connects the wiring pattern 113 to the electrode 104 is arranged on each light emitting element 150. In this case, as shown in FIG. 1B, in an orthogonal projection with respect to the surface 201 of the substrate 101, the plug 114 can be arranged closer to the side of the edge of the electrode 104 than the reflecting member 110. The wiring pattern 113 may be made of a metal such as Al, Cu, or the like or an alloy mainly made of these materials.

Each of FIGS. 2A to 2D showed a case in which each light emitting element 150 is a hexagon and the light emitting elements 150 have a honeycomb arrangement in an orthogonal projection with respect to the surface 201 of the substrate 101. However, the present invention is not limited to this. For example, each light emitting element 150 may have a rectangular shape. For example, a stripe arrangement, a square arrangement, a delta arrangement, or a Bayer arrangement may be adopted as the planar arrangement of the light emitting elements 150. In addition, an organic light emitting display apparatus with a high pixel count can be implemented by arranging the main pixels in a matrix.

Figure 3:
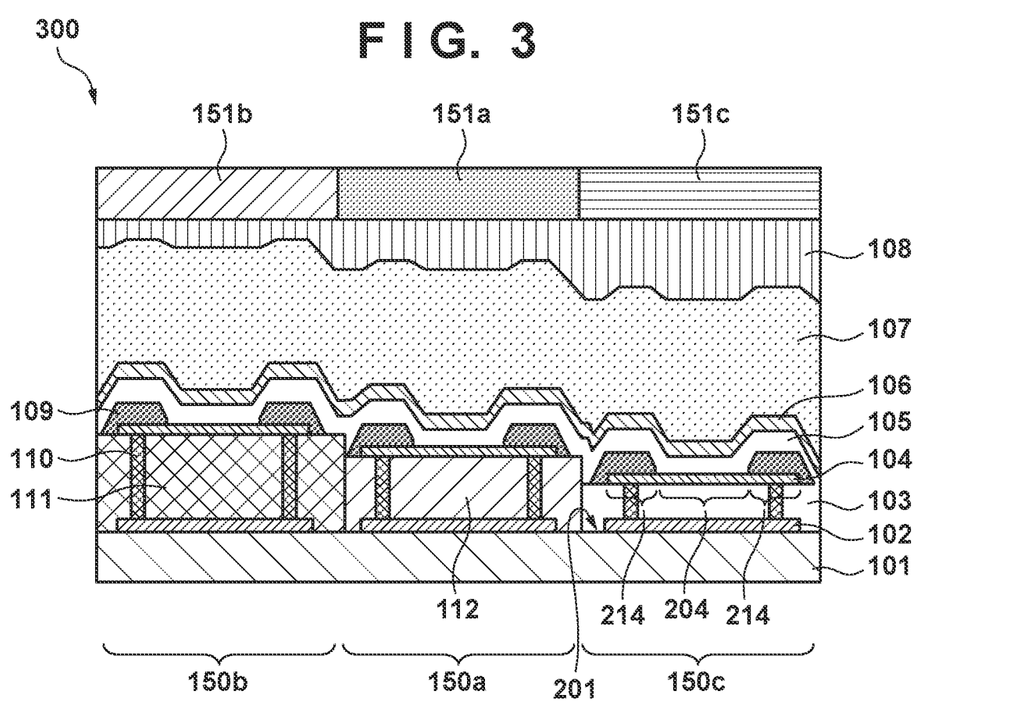
FIG. 3 is a sectional view showing a modification of the organic device shown in FIG. 1A.

FIG. 3 is a modification of the above-described organic device 100 shown in FIG. 1A. An organic device 300 shown in FIG. 3 comprises, in addition to the structure comprised in the organic device 100, an arrangement for optimizing, in each color, the optical distance between the reflection layer 102 and the light emitting position in the light emitting layer of the organic layer 105. A description of arrangements that overlap those of the above-described organic device 100 will be omitted hereinafter.

As shown in FIG. 3, an insulation layer 111 and an insulation layer 112 are arranged on the reflection layer 102 of the light emitting element 150b and on the reflection layer 102 of the light emitting element 150a, respectively. The insulation layer 103 described above is also arranged on the light emitting element 150c. The insulation layers 111 and 112 may be made of an inorganic material such as SiN, SiON, SiO, or the like in the same manner as the insulation layer 103. The insulation layers 111 and 112 can be formed by a known technique such as sputtering, CVD, or the like. The insulation layers 111 and 112 may be formed by using an organic material such as an acrylic resin or a polyimide resin. Although each of the insulation layers 111 and 112 is formed by a single layer in the arrangement shown in FIG. 3, each of the insulation layers 111 and 112 may be formed from a plurality of layers. The insulation layers 103, 111, and 112 may be formed by etching, after an insulation layer corresponding to the thickness of the insulation layer 111 has been formed on the substrate 101, the portion to be the light emitting element 150a and the portion to be the light emitting element 150c so that each portion will have an appropriate thickness. In this case, of the insulation layers 103, 111, and 112, each portion at the same height as the surface 201 of the substrate 101 will be made of the same material. Furthermore, the insulation layers 103, 111, and 112 may be formed separately from each other. In this case, of the insulation layers 103, 111, and 112, each portion at the same height as the substrate 101 may be made of the same material or may be made of a different material.

To optimize, for each color, the optical distance between the reflection layer 102 and the light emitting position in the light emitting layer of the organic layer 105, an optical path length Lr from the reflection layer 102 to the light emitting position in the light emitting layer of the organic layer 105 is set so as to approximately satisfy $$Lr=(2m-(\Phi r/\pi))\times(\lambda/4) \quad (1)$$

where m is a nonnegative integer, $\lambda$ is a wavelength of light transmitted through the color filters 151a, 151b, and 151c, and $\Phi r$ is a phase shift when the light of the wavelength $\lambda$ is reflected by the reflection layer 102.

Also, an optical distance Ls between the light emitting position in the light emitting layer of the organic layer 105 and the reflecting surface (for example, the lower surface) of the electrode 106 is set to approximately satisfy $$Ls=(2m'-(\Phi s/\pi))\times(\lambda/4)=-(\Phi s/\pi))\times(\lambda/4) \quad (2)$$

where m is a nonnegative integer (m'=0 in this arrangement), and $\Phi s$ is a phase shift when the light of the wavelength $\lambda$ is reflected by the electrode 106.

Hence, an all-layer interference L from the reflection layer 102 to the electrode 106 is set to approximately satisfy $$L=Lr+Ls=(2m-\Phi s/\pi)\times(\lambda/4) \quad (3)$$

where $\Phi$ is a sum of ($\Phi r+\Phi s$) of phase shifts when the light of the wavelength $\lambda$ is reflected by the reflection layer 102 and the electrode 106.

In the arrangement shown in FIG. 3, the optical distance Ls expressed by equation (2) will have approximately the same thickness. Thus, the thicknesses of the insulation layer 103, the insulation layer 111, and the insulation layer 112 are set to appropriate values in accordance with the colors to be transmitted by the color filter 151a, the color filter 151b, and the color filter 151c so as to approximately satisfy equations (1) and (3). That is, in the arrangement shown in FIG. 3, the distance between the reflection layer 102 and the electrode 104 of the light emitting element 150a which comprises the color filter 151a is different from the distance between the reflection layer 102 and the electrode 104 of each of the light emitting elements 150b and 150c comprising the color filters 151b and 151c, respectively, each of which transmits a color different from the color filter 151a. More specifically, consider a case in which the color filter 151a transmits light which has a longer wavelength than the color filter 151c. In this case, the distance between the reflection layer 102 and the electrode 104 of the light emitting element 150a which comprises the color filter 151a will be longer than the distance between the reflection layer 102 and the electrode 104 of the light emitting element 150c which comprises the color filter 151c.

Also, in the arrangement shown in FIG. 3 for optimizing the distance between the reflection layer 102 and the light emitting layer of the organic layer 105 to improve the light extraction efficiency, the reflecting member 110 is arranged in each light emitting element 150 of the organic device 300. The reflecting member 110 can suppress the part of the light emitted from the light emitting layer of the organic layer 105 and reflected by the reflection layer 102 from entering each adjacent light emitting element 150. This will suppress the occurrence of color mixing between the adjacent light emitting elements 150.

In the arrangement shown in FIG. 3, since the light emitting elements 150a, 150b, and 150c have different optical path lengths, the heights in the direction perpendicular to the surface 201 of the substrate 101 are different for reflecting members 110. However, the present invention is not limited to this. For example, the heights of the reflecting members 110 may be the same in the light emitting elements 150a, 150b, and 150c. In this case, each reflecting member 110 may be arranged so as to be in contact with the corresponding electrode 104. That is, the insulation layer (corresponding one of the insulation layers 103, 111, and 112) can be arranged between the reflection layer 102 and the reflecting member 110. The reflecting member 110 is arranged along the edge of the electrode 104 in an orthogonal projection with respect to the surface 201 and substrate 101 also in this embodiment. Since the reflecting member 110 reflects the part of light emitted from the light emitting layer of the organic layer 105 and reflected by the reflection layer 102, it is possible to suppress the light from entering the adjacent light emitting element 150.

Figure 4:
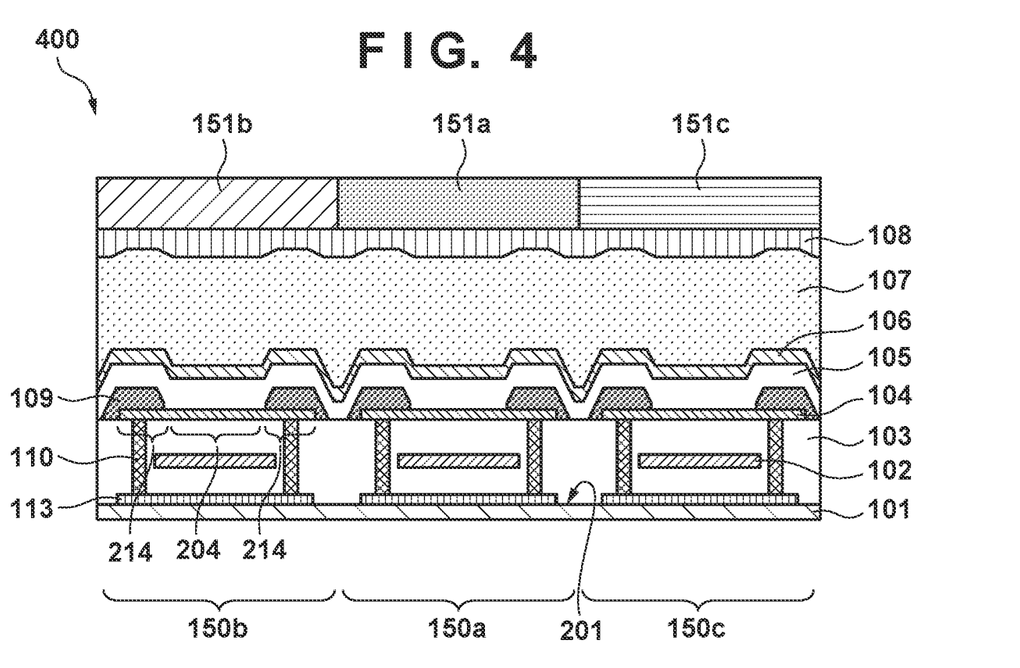
FIG. 4 is a sectional view showing a modification of the organic device shown in FIG. 1A.

FIG. 4 is a sectional view showing a modification of the above-described organic device 100' shown in FIG. 1B. An organic device 400 shown in FIG. 4 comprises an arrangement that uses a plug for electrically connecting the wiring pattern 113 and the electrode 104 as each reflecting member 110. Other arrangements may be the same as those of the above-described organic device 100', and a description will be omitted here.

The reflecting member 110 is arranged in each light emitting element 150 in the organic device 400 as well. Hence, in a manner similar to the organic device 100, 100', 300 and 400 described above, the part of light emitted from the light emitting layer of the organic layer 105 and reflected by the reflection layer 102 is reflected by the reflecting member 110, and the light can be suppressed from entering the adjacent light emitting element 150. Therefore, the generation of color mixing between the adjacent light emitting elements 150 can be suppressed.

In the organic device 400 shown in FIG. 4, the wiring pattern 113 supplies power to the electrode 104. In a case in which power is to be supplied from the reflection layer 102 to the electrode 104, a barrier layer may be formed on the surface of the reflection layer 102 to improve the reliability of the reflection layer 102, but the formation of this barrier layer may reduce the reflectivity of the reflection layer 102. On the other hand, in a case in which power is to be supplied from the wiring pattern 113 to the electrode 104 in the manner of the organic device 400, the reflection layer 102 need only function as a light reflection layer and a barrier layer need not be formed on the surface of the reflection layer. Therefore, the reduction in the reflectivity of the reflection layer 102 due to the formation of a barrier layer can be suppressed.

An example of a method of manufacturing the organic device 100 shown in FIG. 1A will be described next. First, a known semiconductor processing technique or the like is used to form, on the substrate 101 made of silicon, a switching element such as a transistor or the like, wiring, and an interlayer insulation film (all not shown). The interlayer insulation film can be made of any material as long as it can ensure insulation from wiring which is not to be connected and form a contact hole to ensure the conductivity between the switching element or the like provided on the substrate and the reflection layer 102 which functions as a wiring pattern to supply power to the electrode 104. The interlayer insulation film can be made of, for example, a resin such as polyimide, silicon oxide, silicon nitride, or the like. After the formation of the interlayer insulation film, the reflection layer 102 is formed by patterning a stacked structure made by stacking Ti, TiN, Al, and Ti by sputtering. A stacked structure made by stacking silicon oxide and silicon nitride is formed as the insulation layer 103 on the reflection layer 102. A contact hole is formed in the insulation layer 103 by photolithography, and the reflecting member 110 is formed in the contact hole. After the reflecting member 110 has been formed, ITO is deposited and patterned to form the electrode 104. In the organic device 100, each reflecting member 110 functions as a plug to electrically connect the electrode 104 and the reflection layer 102 which also functions as a wiring pattern to supply power to the electrode 104. Next, the partition wall 109 as an insulator for insulating the electrode 104. The partition wall 109 is made of silicon oxide and is formed so that the film thickness at the peripheral portion 214 of the electrode 104 will be 65 nm.

After the formation of the partition wall 109, the organic layer 105 having a thickness of 100 nm is formed on the electrode 104 by vapor deposition. The electron injection layer of the organic layer 105 is formed by depositing lithium fluoride at a thickness of 1 nm. After the formation of the organic layer 105, Ag and Mg are vapor-deposited together at a ratio of 1:1 to form the electrode 106 having a thickness of 10 nm. Subsequently, an SiN film having a thickness of 2 µm is deposited as the sealing layer 107 by CVD. Furthermore, the planarization layer 108 is formed by spin-coating acrylic resin to a thickness of 300 nm.

Next, the color filters 151 are formed on the planarization layer 108. Three color-filters of red, green, and blue are arranged as the color filters 151. First, the red color filter 151a is formed on the light emitting element 150a. Next, the green color filter 151b is formed on the light emitting element 150b. In addition, the blue color filter 151c is formed on the light emitting element 150c. The order of the formation of the color filters 151a, 151b, and 151c is not limited to this.

The organic device 100 is formed by using the processes described above.

In this case, a material which has a large work function may be used as the material to form an electrode which is to be the anode among the electrode 104 and electrode 106. It is possible to use, for example, a single metal element such as Au, Pt, Ag, Cu, Ni, Pd, Co, Se, V, W, or the like, a mixture of these elements, an alloy obtained by combining these elements, or a metal oxide such as tin oxide, zinc oxide, indium oxide, ITO, IZO, or the like. It is also possible to use a conductive polymer such as polyaniline, polypyrrole, polythiophene, or the like.

On the other hand, a material which has a small work function may be used as the material to form an electrode which is to be the cathode among the electrode 104 and electrode 106. It is possible to use, for example, an alkali metal such as Li or the like, an alkaline earth metal such as Ca or the like, a single metal such as Al, Ti, Mn, Ag, Pb, Cr, or the like, or a mixture of these metals. An alloy obtained by combining these single metals can also be used. It is possible to use, for example, Mg—Ag, Al—Li, Al—Mg, Ag—Cu, Zn—Ag, or the like. It is also possible to use a metal oxide such as ITO or the like. A single type of material may be used alone or two or more types of materials may be used in combination among these electrode materials. Also, the cathode may have a single layer structure or a stacked structure. In particular, it is possible to use Ag, and an Ag alloy can be used to suppress the aggregation of Ag. The alloy can have any ratio as long as the aggregation of Ag can be suppressed. For example, the ratio may be Ag:another metal=1:1.

Although an example in which a 2-µm SiN layer is formed as the sealing layer 107 has been described above, the present invention is not limited to this. For example, it is possible to suppress display failure by adhering glass provided with an absorbent on the cathode to suppress water or the like from intruding the organic compound layer. Also, to suppress water or the like from intruding the organic layer 105, the sealing layer 107 may be formed upon conveying, for example, the device to another chamber without breaking the vacuum state after the electrode 106 has been formed. In addition, for example, it is possible to stack $Al_2O_3$ by atomic layer deposition (ALD) after depositing SiN as the sealing layer 107 by CVD or the like.

Also, to form the color filters 151, for example, color filters corresponding to the size of the pixels can be arranged on another substrate, and the color filter substrate may be bonded with the substrate 101 on which the light emitting elements 150 have been provided. Also, for example, the color filters 151 may also be formed by patterning each color filter on the planarization layer 108 by photolithography as described above.

The organic layer 105 that can comprise the hole injection layer, the hole transport layer, the electron blocking layer, the light emitting layer, the hole blocking layer, the electron transport layer, the electron injection layer, and the like can be formed according to the following method. Dry processing such as vacuum deposition, ionization deposition, sputtering, plasma CVD, or the like can be used to form the organic layer 105. Alternatively, instead of dry processing, it is possible to use wet processing in which a constituent material is dissolved into an appropriate solvent to form each layer by employing a known coating method (spin coating, dipping, casting, the Langmuir-Blodgett method (LB method), an inkjet method, or the like).

In this case, forming each layer by vacuum deposition, solution coating, or the like is superior in terms of temporal stability since crystallization or the like will hardly occur. In addition, if deposition is to be formed by using a coating method, each film can be formed by combining an appropriate binder resin.

A polyvinyl carbazole resin, a polycarbonate resin, a polyester resin, an ABS resin, an acrylic resin, a polyimide resin, a phenol resin, an epoxy resin, a silicone resin, a urea resin, or the like can be used as the binder resin described above. However, the present invention is not limited to these resins. Also, a single type of binder resin may be used alone as a homopolymer or a copolymer or two or more types of binder resins may be mixed and used. Furthermore, additives such as a known plasticizer, an antioxidant, a UV absorbent, and the like may be mixed with the above-described binder resin as needed.

Figure 6:
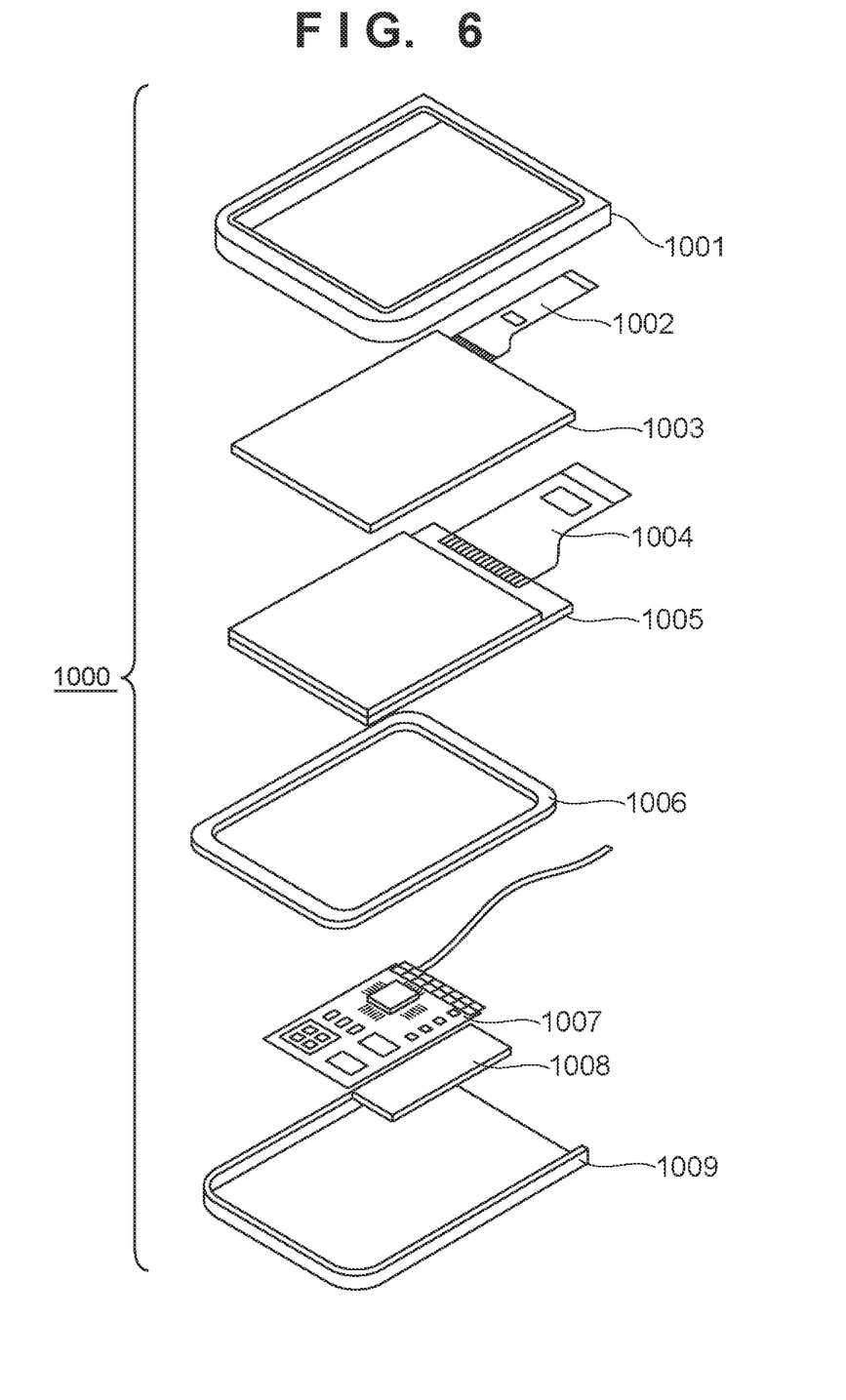
FIG. 6 is a view showing an example of a display apparatus using the organic device shown in FIG. 1A.

Application examples in which the organic device 100, 100', 300, or 400 according to this embodiment is applied to any one of a display apparatus, an image capturing apparatus, a portable device, an illumination apparatus, and a moving body will be described hereinafter with reference to FIGS. 6 to 11. FIG. 6 is a schematic view showing an example of a display apparatus using the organic device 100, 100', 300, or 400 according to this embodiment. A display apparatus 1000 can comprise a touch panel 1003, a display panel 1005, a frame 1006, a circuit substrate 1007, and a battery 1008 between an upper portion cover 1001 and a lower portion cover 1009. Flexible print circuits (FPC) 1002 and 1004 are connected to the touch panel 1003 and the display panel 1005. An active element such as a transistor or the like is arranged on the circuit substrate 1007. The battery 1008 need not be arranged unless the display apparatus 1000 is a portable device, and need not be arranged in the position shown in FIG. 6 even if the display apparatus is a portable device. The above-described organic device 100, 100', 300, or 400 that functions as a light emitting apparatus by comprising the organic layer 105 which comprises an organic light emitting material, such as organic EL, can be used as the display panel 1005. The organic device 100, 100', 300, or 400 that functions as the display panel 1005 operates by being connected to an active element such as a transistor or the like arranged on the circuit substrate 1007.

The display apparatus 1000 shown in FIG. 6 may be used as a display unit of an image capturing apparatus that comprises an optical unit comprising lenses and an image capturing element configured to receive light that passed through the optical unit. The image capturing apparatus can comprise a display unit for displaying information obtained by the image capturing element. The display unit can also be a display unit exposed outside the image capturing apparatus or a display unit arranged inside the viewfinder. The image capturing apparatus may be a digital camera or a digital video camera.

Figure 7:
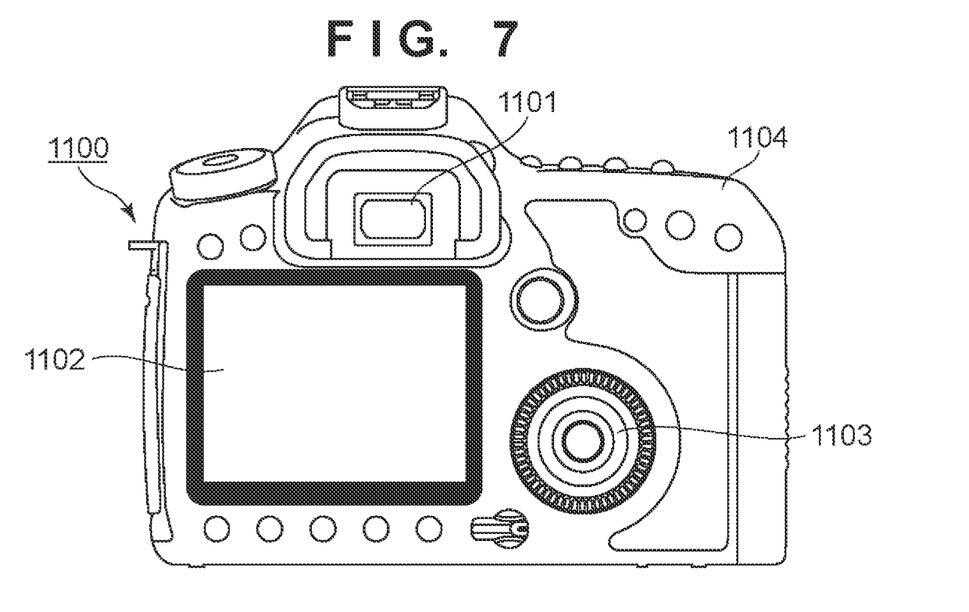
FIG. 7 is a view showing an example of an image capturing apparatus using the organic device shown in FIG. 1A.

FIG. 7 is a schematic view showing an example of an image capturing apparatus using the organic device 100, 100', 300, or 400 according to this embodiment. An image capturing apparatus 1100 can comprise a viewfinder 1101, a back surface display 1102, an operation portion 1103, and a housing 1104. The above-described organic device 100, 100', 300, or 400 that functions as a light emitting apparatus by comprising the organic layer 105 which comprises an organic light emitting material can be used as the viewfinder 1101 which is a display unit. In this case, the organic device 100, 100', 300, or 400 may not only display an image to be captured, but also environment information, an image capturing instruction, and the like. The environment information may be information of the intensity of natural light, the direction of the natural light, the speed of the movement of an object, the possibility that the object is shielded by a shielding object, and the like.

Since the timing suitable for image capturing frequently tends to be a short period of time, it is better to display information as quickly as possible. Hence, the above-described organic device 100, 100', 300, or 400 comprising the organic layer 105 which comprises an organic light emitting material can be used as the viewfinder 1101. This is because an organic light emitting material has a high response speed. The organic device 100, 100', 300, or 400 using an organic light emitting material can be used more suitably, than a liquid crystal display apparatus, for these apparatuses that require high display speed.

The image capturing apparatus 1100 comprises an optical unit (not shown). The optical unit comprises lenses, and forms an image on an image capturing element (not shown) that receives light that passed through the optical unit and is contained in the housing 1104. The focal points of the lenses can be adjusted by adjusting their relative positions. This operation can be performed automatically.

The above-described organic device 100, 100', 300, or 400 that functions as a light emitting apparatus by comprising the organic layer 105 which comprises an organic light emitting material can be used as a display unit of a portable device. In this case, the organic device may have both a display function and an operation function. The mobile device can be a mobile phone such as smartphone or the like, a tablet, a head-mounted display, or the like.

Figure 8:
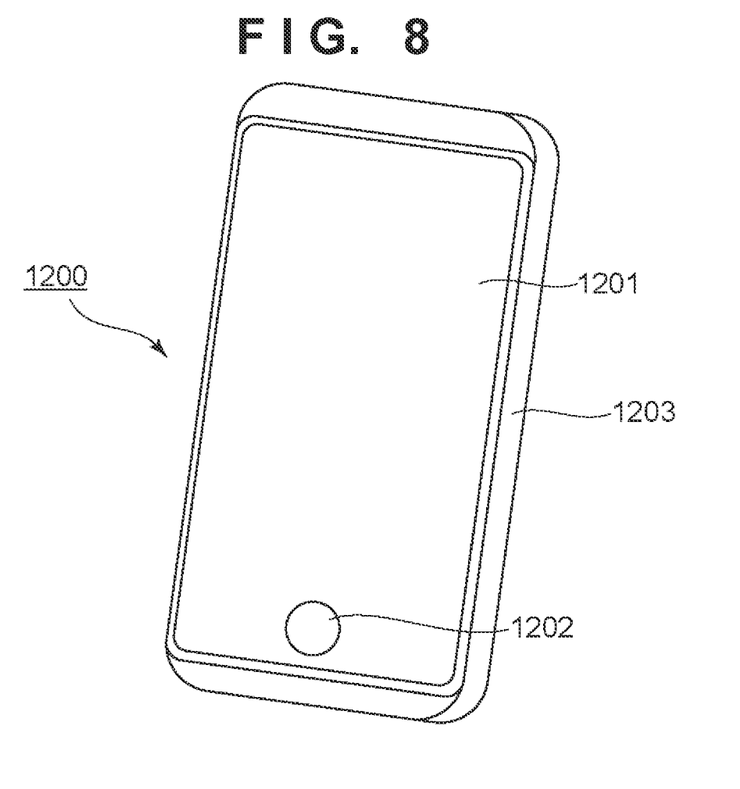
FIG. 8 is a view showing a portable device using the organic device shown in FIG. 1A.

FIG. 8 is a schematic view showing an example of a portable device using the organic device 100, 100', 300, or 400 according to this embodiment. A portable device 1200 comprises a display unit 1201, an operation unit 1202, and a housing 1203. The housing 1203 can comprise a circuit, a printed board which comprises the circuit, a battery, and a communication unit. The operation portion 1202 can either be a button or a touch-panel-type reaction unit. The operation unit 1202 can also be a biometric authentication unit that performs unlocking or the like by authenticating a fingerprint. A portable device comprising a communication unit can also be regarded as a communication apparatus. The above-described organic device 100, 100', 300, or 400 that functions as a light emitting apparatus by comprising the organic layer 105 which comprises an organic light emitting material can be used as the display unit 1201.

Figure 9A:
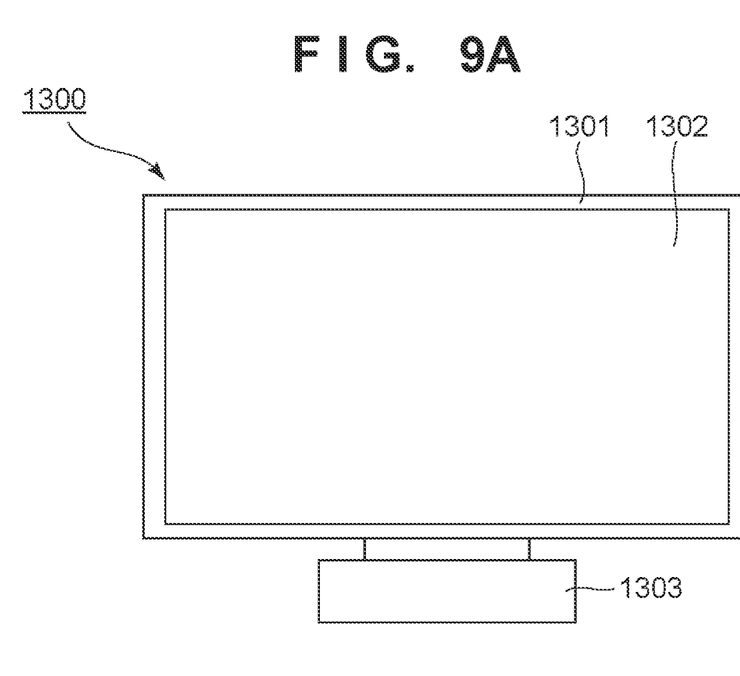
FIGS. 9A and 9B are views showing an example of another display apparatus using the organic device shown in FIG. 1A.
Figure 9B:
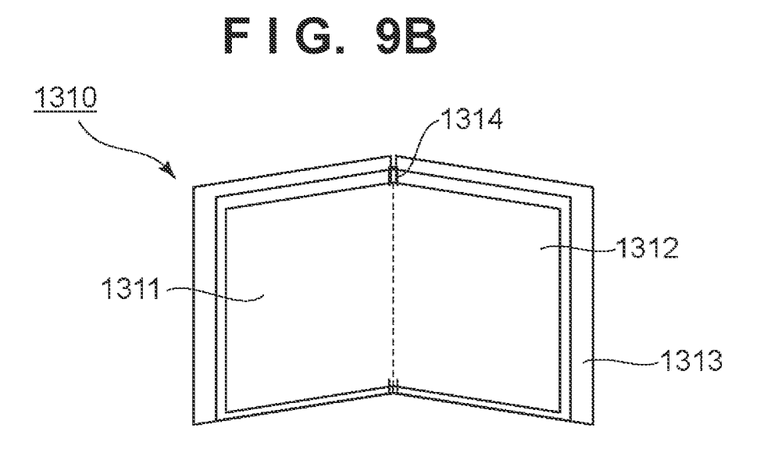

FIGS. 9A and 9B are schematic views showing examples of a display apparatus using the organic device 100, 100', 300, or 400 according to this embodiment. FIG. 9A shows a display apparatus such as a television monitor or a PC monitor. A display apparatus 1300 comprises a frame 1301 and a display unit 1302. The above-described organic device 100, 100', 300, or 400 that functions as a light emitting apparatus by comprising the organic layer 105 which comprises an organic light emitting material can be used as the display unit 1302. The display apparatus 1300 may also comprise a base 1303 that supports the frame 1301 and the display unit 1302. The base 1303 is not limited to the form shown in FIG. 9A. For example, the lower side of the frame 1301 may also function as the base 1303. In addition, the frame 1301 and the display unit 1302 can be bent. The radius of curvature in this case can be 5,000 (inclusive) to 6,000 (inclusive) mm.

FIG. 9B is a schematic view showing another example of the display apparatus using the organic device 100, 100', 300, or 400 according to this embodiment. A display apparatus 1310 shown in FIG. 9B can be folded, that is, the display apparatus 1310 is a so-called foldable display apparatus. The display apparatus 1310 comprises a first display unit 1311, a second display unit 1312, a housing 1313, and a bending point 1314. The above-described organic device 100, 100', 300, or 400 that functions as a light emitting apparatus by comprising the organic layer 105 which comprises an organic light emitting material can be used as each of the first display unit 1311 and the second display unit 1312. The first display unit 1311 and the second display unit 1312 can be one seamless display device. The first display unit 1311 and the second display unit 1312 can be divided from the bending point. The first display unit 1311 and the second display unit 1312 can display different images and can also display a single image together.

Figure 10:
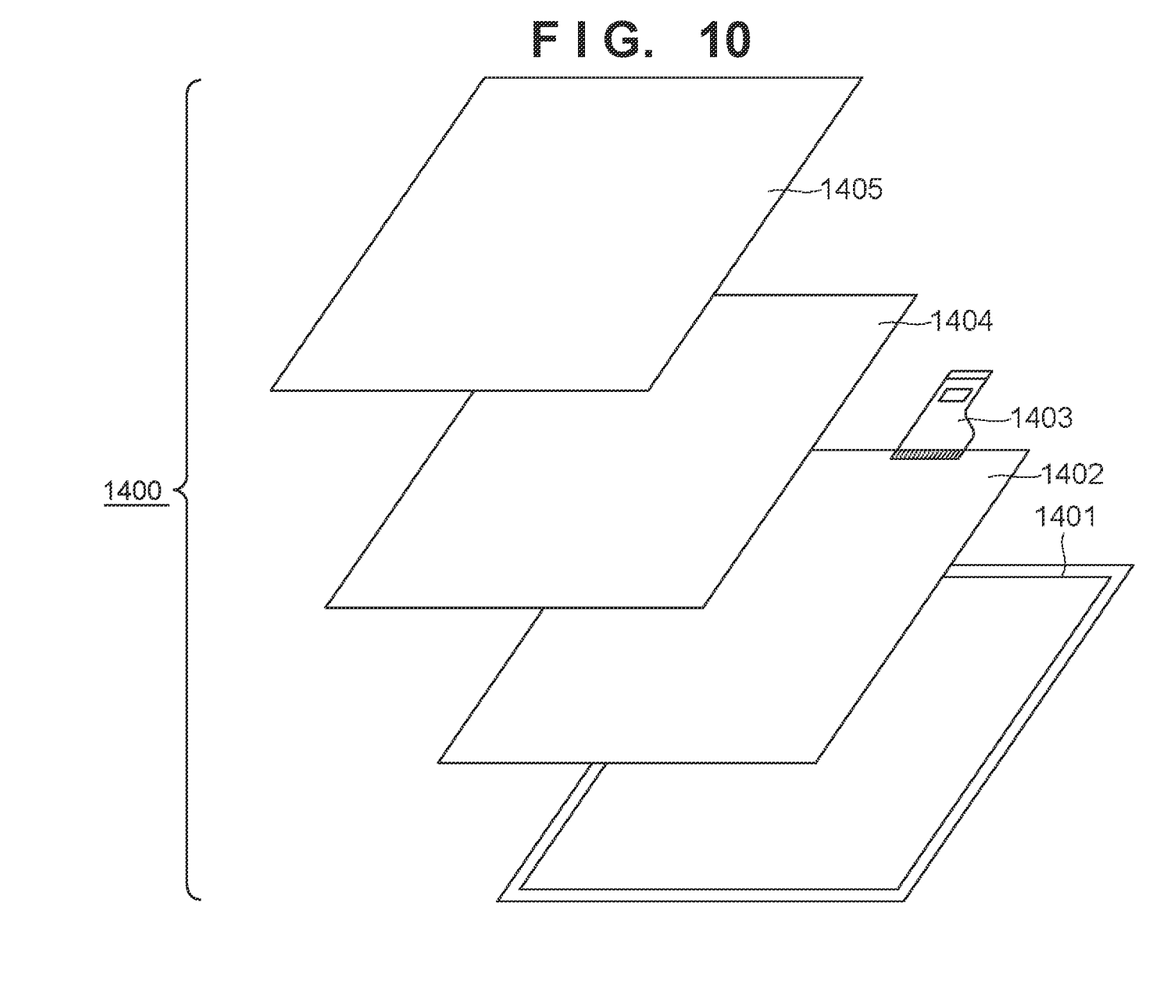
FIG. 10 is a view showing an example of an illumination apparatus using the organic device shown in FIG. 1A.

FIG. 10 is a schematic view showing an example of the illumination apparatus using the organic device 100, 100', 300, or 400 according to this embodiment. An illumination apparatus 1400 can comprise a housing 1401, a light source 1402, a circuit board 1403, an optical film 1404, and a light diffusing unit 1405. The above-described organic device 100, 100', 300, or 400 that functions as a light emitting apparatus by comprising the organic layer 105 which comprises an organic light emitting material can be used as the light source 1402. The optical film 1404 can be a filter that improves the color rendering of the light source. The light diffusing unit 1405 can light up or the like to deliver the light of the light source over a broad range by effectively diffusing the light. The illumination apparatus 1400 can also comprise a cover on the outermost portion. The illumination apparatus 1400 may comprise both the optical film 1404 and the light diffusing unit 1405 or may comprise only one of these components.

The illumination apparatus 1400 is an apparatus for illuminating a room or the like. The illumination apparatus 1400 can emit white light, natural white light, or light of any color from blue to red. The illumination apparatus 1400 can also comprise a light control circuit for controlling these light components. The illumination apparatus 1400 can also comprise a power supply circuit to be connected to the organic device 100, 100', 300, or 400 that functions as the light source 1402. The power supply circuit can be a circuit for converting an AC voltage into a DC voltage. "White" has a color temperature of about 4,200 K, and "natural white" has a color temperature of about 5,000 K. The illumination apparatus 1400 may also have a color filter. In addition, the illumination apparatus 1400 can have a heat radiation unit. The heat radiation unit radiates the internal heat of the apparatus to the outside of the apparatus, and examples are a metal having a high specific heat and liquid silicon.

Figure 11:
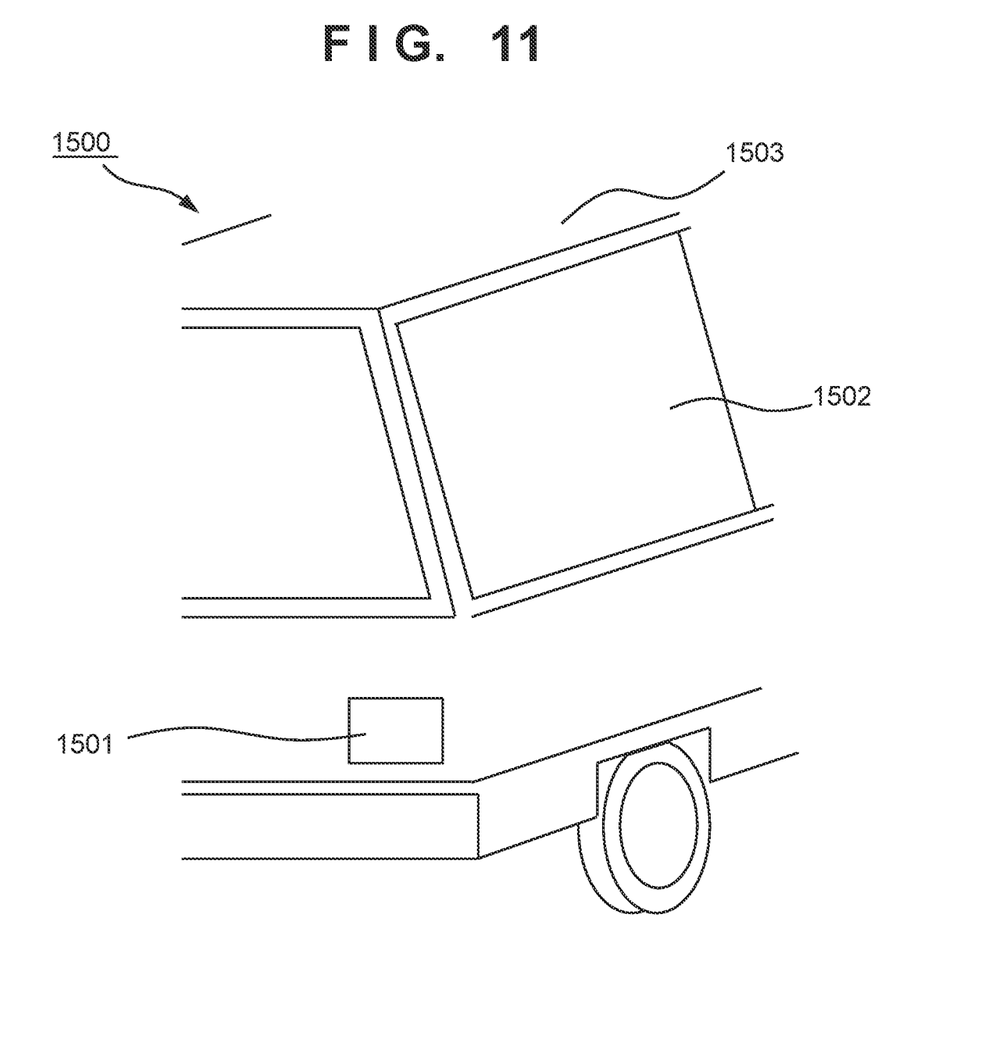
FIG. 11 is a view showing an example of an automobile using the organic device shown in FIG. 1A.

FIG. 11 is a schematic view of an automobile comprising a taillight as an example of a vehicle lighting device using the organic device 100, 100', 300, or 400 according to this embodiment. An automobile 1500 has a taillight 1501, and the taillight 1501 is turned on when a braking operation or the like is performed. The automobile is an example of a moving body, and the moving body can be a ship, a drone, an airplane, or the like. The moving body can comprise a main body and a lighting device installed in the main body. The lighting device may also be an apparatus that notifies the current position of the main body.

The above-described organic device 100, 100', 300, or 400 that functions as a light emitting apparatus by comprising the organic layer 105 which comprises an organic light emitting material can be used as the taillight 1501. The taillight 1501 can have a protection member for protecting the organic device 100, 100', 300, or 400 that functions as the taillight 1501. Although the material of the protection member is not limited as long as it is a transparent material with a high degree of strength to a certain extent, it may be made of polycarbonate or the like. The protection member can also be formed by mixing a furandicarboxylic acid derivative or an acrylonitrile derivative in polycarbonate.

The automobile 1500 can comprise a vehicle body 1503 and a window 1502 attached to the vehicle body 1503. This window can be a window for checking the front and rear of the automobile, and can also be a transparent display. The above-described organic device 100, 100', 300, or 400 that functions as a light emitting apparatus by comprising the organic layer 105 which comprises an organic light emitting material can be used as this transparent display. In this case, the constituent materials such as the electrodes of the organic device 100, 100', 300, or 400 are formed by transparent members.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-053478, filed Mar. 20, 2019 which is hereby incorporated by reference herein in its entirety.

What is claimed is:

1. An organic device comprising a substrate and light emitting elements arranged on a surface of the substrate,
    wherein each of the light emitting elements comprises, from a side of the surface, a reflection layer, a light-shielding member arranged above the reflection layer, a first electrode arranged above the light-shielding member, an organic layer comprising a light emitting layer which is arranged over the first electrode, and a second electrode arranged over the organic layer,
    wherein the light emitting elements comprise a first light emitting element and a second light emitting element arranged adjacent to each other, wherein, in an orthogonal projection with respect to the surface, a length in a second direction of a portion of the light-shielding member is longer than a length of the portion in a first direction, the portion being arranged in a region where the first light emitting element and the second light emitting element are adjacent to each other, and wherein the first direction is a direction in which the first light emitting element and the second light emitting element are arranged and the second direction is a direction perpendicular to the first direction.

2. The device according to claim 1, wherein the second direction is a direction along an edge of the first electrode in the region where the first light emitting element and the second light emitting element are adjacent to each other.

3. The device according to claim 1, wherein in the orthogonal projection with respect to the surface, the light-shielding member is continuously arranged along a perimeter of an edge of the first electrode.

4. The device according to claim 1, wherein in the orthogonal projection with respect to the surface, the light-shielding member is partially arranged along an edge of the first electrode.

5. The device according to claim 1, wherein the shielding member is partially arranged along an edge of the first electrode in the orthogonal projection with respect to the substrate, and in the orthogonal projection with respect to the substrate, the light-shielding member is arranged in at least one of a portion, of the edge of the first electrode arranged in the first light emitting element, which is adjacent to the second light emitting element, and a portion, of the edge of the first electrode arranged in the second light emitting element, which is adjacent to the first light emitting element.

6. The device according to claim 1, wherein the first electrode comprises: a central portion which is in contact with the organic layer; and a peripheral portion which surrounds the central portion and in which an insulator is arranged between the first electrode and the organic layer, and wherein in the orthogonal projection with respect to the surface, the light-shielding member is arranged in a position which overlaps the peripheral portion.

7. The device according to claim 1, wherein each of the light emitting elements further comprises a color filter above the second electrode, and a distance between the first electrode and the reflection layer of a light emitting element comprising a first color filter of the light emitting elements is different from a distance between the first electrode and the reflection layer of a light emitting element comprising a second color filter, which transmits a different color from the first color filter, of the light emitting elements.

8. The device according to claim 7, wherein the first color filter transmits light which has a longer wavelength than light transmitted by the second color filter, and the distance between the first electrode and the reflection layer of the light emitting element comprising the first color filter of the light emitting elements is longer than the distance between the first electrode and the reflection layer of the light emitting element comprising the second color filter of the light emitting elements.

9. The device according to claim 1, wherein the light-shielding member electrically connects the reflection layer to the first electrode.

10. The device according to claim 1, wherein each of the light emitting elements further comprises, between the reflection layer and the surface, a wiring pattern configured to supply power to the first electrode.

11. The device according to claim 10, wherein the light-shielding member electrically connects the wiring pattern to the first electrode.

12. The device according to claim 10, wherein in the orthogonal projection with respect to the surface, a plug configured to electrically connect the wiring pattern to the first electrode is arranged closer to the side of an edge of the first electrode than the light-shielding member.

13. The device according to claim 1, wherein the organic layer is shared by the light emitting elements.

14. The device according to claim 1, wherein the second electrode is shared by the light emitting elements.

15. A display apparatus comprising:
an organic device according to claim 1; and
an active element connected to the organic device.

16. An image capturing apparatus comprising:
an optical unit that comprises lenses;
an image capturing element configured to receive light that passed through the optical unit; and
a display unit configured to display an image,
wherein the display unit displays an image captured by the image capturing element and comprises an organic device according to claim 1.

17. An illumination apparatus comprising:
a light source; and
at least one of a light diffusing unit and an optical film,
wherein the light source comprises an organic device according to claim 1.

18. A moving body comprising:
a body; and
a lighting device arranged on the body,
wherein the lighting device comprises an organic device according to claim 1.

19. An organic device comprising a substrate and light emitting elements arranged on a surface of the substrate,
wherein each of the light emitting elements comprises, from a side of the surface, a reflection layer, a light-shielding member arranged above the reflection layer, a first electrode arranged above the light-shielding member, an organic layer comprising a light emitting layer which is arranged over the first electrode, and a second electrode arranged over the organic layer, and
in an orthogonal projection with respect to the surface, the light-shielding member is arranged along an edge of the first electrode.

20. The device according to claim 19, wherein the light emitting elements comprise a first light emitting element and a second light emitting element arranged adjacent to each other,
in the orthogonal projection with respect to the surface, the light-shielding member is arranged partially along an edge of the first electrode, and
in the orthogonal projection with respect to the surface, the light-shielding member is arranged in at least one of a portion, of the edge of the first electrode arranged in the first light emitting unit, which is adjacent to the second light emitting element, and a portion, of the edge of the first electrode arranged in the second light emitting element, which is adjacent to the first light emitting element.

* * * * *